United States Patent [19]

Hirose et al.

[11] Patent Number: 4,988,888
[45] Date of Patent: Jan. 29, 1991

[54] CMOS OUTPUT CIRCUIT WITH INTERMEDIATE POTENTIAL SETTING MEANS

[75] Inventors: Toshihiko Hirose; Tomohisa Wada, both of Hyogo, Japan

[73] Assignee: Mitsubishi Denki Kabushiki Kaisha, Tokyo, Japan

[21] Appl. No.: 361,725

[22] Filed: Jun. 5, 1989

Related U.S. Application Data

[63] Continuation of Ser. No. 113,308, Oct. 28, 1987, abandoned.

[30] Foreign Application Priority Data

Oct. 28, 1986 [JP] Japan .................. 61-257364

[51] Int. Cl.⁵ ............. H03K 17/16; H03K 19/024; H03K 3/01
[52] U.S. Cl. .................. 307/443; 307/451; 307/473; 307/270; 307/246
[58] Field of Search ............. 307/443, 451, 473, 579, 307/585, 270, 263, 264, 246

[56] References Cited

U.S. PATENT DOCUMENTS

| | | | |
|---|---|---|---|
| 4,329,600 | 5/1982 | Stewart | 307/473 |
| 4,417,161 | 11/1983 | Uya | 307/451 |
| 4,477,741 | 10/1984 | Moser, Jr. | 307/473 |
| 4,542,310 | 9/1985 | Ellis et al. | 307/579 |
| 4,567,378 | 1/1986 | Raver | 307/443 |
| 4,570,091 | 2/1986 | Yasuda et al. | 307/473 |
| 4,638,187 | 1/1987 | Boler et al. | 307/451 |

OTHER PUBLICATIONS

Wada et al., "34-NS 1-MBIT CMOS SRAM Using Triple Polysilicon", IEEE Journal of Solid-State Cricuits, vol. SC-22, No. 5, 10/87, pp. 729-730.

"Two 65K CMOS . . . Time", by Flannagan; ISSCC 86, 2-20-86; 1986, IEEE International . . . Conference, p. 208.

"Two 13-ns 64K . . . Techniques", by Flannagan, IEEE Journal . . . Circuits, vol. SC-21, No. 5, 10-86, pp. 692-703.

Modern M.O.S. Technology, by Ong, p. 216, Copyright 1984 by McGraw-Hill, Inc.

Primary Examiner—Timothy P. Callahan
Attorney, Agent, or Firm—Sughrue, Mion, Zinn, Macpeak & Seas

[57] ABSTRACT

In a semiconductor integrated circuit device, an output MOSFET circuit includes a first N-type MOSFET and a first P-type MOSFET. The output circuit is controlled by two different control signals having two different levels to provide a signal at an output terminal at a junction between the two MOSFETs. An intermediate potential setting circuit includes a second N-type MOSFET and a second P-type MOSFET, and is followed by the output MOSFET circuit. The intermediate potential setting circuit sets the potential of the output terminal to an intermediate potential in accordance with an intermediate potential setting signal applied to the intermediate potential setting circuit prior to variation of the output. With this structure comsumption is reduced and high speed operation is made possible.

7 Claims, 2 Drawing Sheets

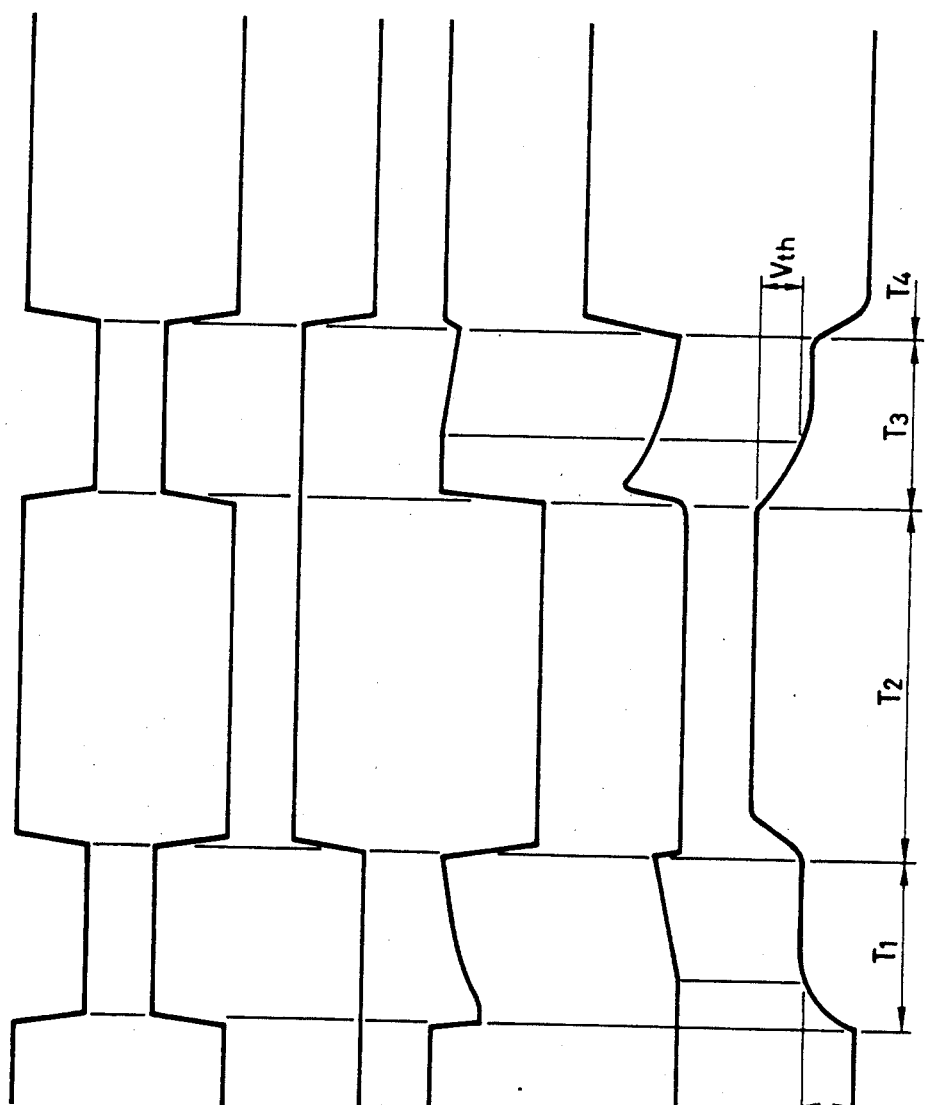

4,988,888

CMOS OUTPUT CIRCUIT WITH INTERMEDIATE POTENTIAL SETTING MEANS

This is a continuation of application Ser. No. 07/113,308, filed Oct. 28, 1987 now abandoned.

BACKGROUND OF THE INVENTION

This invention relates to a semiconductor integrated circuit device suitable for the output circuit of a semiconductor memory having a plurality of output bits.

In a device, such as a semiconductor memory having a plurality of output bits, and thus having a plurality of output circuits including transistors which are large in current drive capacity for external circuits, when these output circuits operate simultaneously, significant noise is induced by inductance of a power source line, a grounding line and the like thus causing erroneous operations such as errors in writing data and oscillations. This difficulty has been eliminated by the provision of an intermediate potential setting circuit in which the output terminal is held at an intermediate potential prior to outputting data, so that the charging or discharging current accompanying variation of the output is decreased in peak value.

FIG. 3 shows an example of such conventional intermediate potential setting circuit. In FIG. 3, reference numeral 1 designates an output MOSFET circuit comprising a P-type MOSFET Q3 and an N-type MOSFET Q4, and 2, an intermediate potential setting circuit comprising N-type MOSFETs Q2 and Q13. Further in FIG. 3, reference character DP designates a first output control signal; DN, a second output control signal; PS1, a third output control signal; Dout, an output terminal; CL, a load capacitor; Vcc, a power source line; and GND, a ground line.

In operation, in order to give an intermediate potential to the output terminal Dout, first the first output control signal DP is raised to a high level (hereinafter referred to merely as "H", when applicable) while the second output control signal DN is set to a low level (hereinafter referred to merely as "L", when applicable). In this operation, both of the MOSFETs Q3 and Q4 forming the output MOSFET circuit 1 are non-conductive (off), and the output terminal Dout is held at "H" or "L" depending on whether or not the load capacitor CL is charged. Then, the third output control signal PS1 is raised to "H". In this connection, (1) if the output terminal Dout is initially at "L", the drain, gate and source of the N-type MOSFET Q2 are "H", "H" and "L", respectively, and therefore the MOSFET Q2 is conductive (on). Accordingly, a charging current flows from the line to which the first output control signal DP is applied, through the MOSFET Q2 into the load capacitor CL, so that the potential of the output terminal Dout is raised.

(2) On the other hand, the drain, gate and source of the N-type MOSFET Q13 are initially held at "L", "H" and "L", respectively, and therefore the MOSFET Q13 is non-conductive (off). However, the potential of the output terminal Dout of the drain increases as described above (paragraph (1)) and when it exceeds the threshold voltage Vth of the MOSFET Q13, the MOSFET Q13 is rendered conductive (on). Therefore, a through current in addition to the charging current flows in the MOSFETs Q2 and Q13. In this operation, as the source of the MOSFET Q13 is maintained at "L", the threshold voltage Vth is free from a substrate bias effect, and the channel resistance of the MOSFET Q13 is decreased as the potential of the output terminal Dout of the drain increases. The term "substrate bias effect" as used herein is intended to mean that, when the substrate is reverse-biased, i.e., when the potentials of the source and the drain of an N-type MOSFET are made higher than the ground potential, or when the potentials of the source and the drain of a P-type MOSFET are made lower than the power source potential, the threshold value is increased and the channel resistance is increased. On the other hand, the channel resistance of the MOSFET Q2 is minimum immediately after it is made conductive (on) and increases as the potential of the output terminal Dout of the source increases. As is apparent from the above description, it is impossible to make the sum of the channel resistances of the MOSFETs Q2 and Q13 large from when the intermediate potential setting signal PS1 is applied, and therefore a relatively large through current flows from the beginning of the intermediate potential setting period.

(3) Finally, the channel resistance of the MOSFETs Q2 and Q13 are made constant, so that the output terminal Dout is held at an intermediate potential which is determined by these channel resistances.

(4) In the case where the output terminal Dout is initially held at "H", first the MOSFET Q13 is turned on, so that a discharging current flows from the load capacitor CL through the MOSFET Q13 to the line to which the second output control signal DN is applied, and accordingly the potential of the output terminal Dout is decreased.

(5) On the other hand, the N-type MOSFET Q2 is non-conductive (off) because the source and the drain thereof are at "H"; however, it is rendered conductive (on) when the drain-source voltage becomes higher than the threshold voltage Vth as a result of the decrease of the potential of the output terminal Dout. However, since the threshold voltage Vth is affected by the aforementioned substrate bias effect, the channel resistance of the N-type MOSFET Q2 is higher than that of the MOSFET Q13 even after the MOSFET Q2 is turned on. Accordingly, the through current provided when the potential of the output terminal Dout is changed from "H" to the intermediate potential is smaller than that provided when the potential of the output terminal Dout is changed from "L".

As was described above, after the potential of the output terminal is set to the intermediate potential from "H" or "L", the third output control signal PS1 is set to "L", and the potentials of the first and second output control signals DP and DN are newly set, so that the data is provided at the output terminal Dout.

However, the above-described semiconductor integrated circuit device is disadvantageous in that, since the intermediate potential setting MOSFET circuit is made up of the N-type MOSFETs as was described above, the through currents flowing in these MOSFETs are relatively large, and especially, a large amount of current is consumed when the potential of the output terminal is changed from "L" to the intermediate potential.

SUMMARY OF THE INVENTION

In view of the foregoing, an object of this invention is to provide a semiconductor integrated circuit device with a intermediate potential setting circuit which is low in the consumption of current and high in the speed of operation.

The foregoing object and other objects of the invention have been achieved by the provision of a semiconductor integrated circuit device which, according to the invention, comprises: an output MOSFET circuit including a first P-type MOSFET and a first N-type MOSFET, and an intermediate potential setting circuit including a second N-type MOSFET connected between the gate of the first P-type MOSFET and the output terminal thereof and a second P-type MOSFET connected between the gate of the first N-type MOSFET and the output terminal thereof.

According to the present invention, an intermediate potential setting signal, which is applied prior to the variation of the output, enables the output terminal to be rapidly set to the intermediate potential and the intermediate potential setting circuit to operate at high speed and at low consumption of current.

The nature, principle and utility of the invention will become more apparent from the following detailed description when read in conjunction with the accompanying drawings in which like parts are designated by like reference numerals or characters.

BRIEF DESCRIPTION OF THE DRAWINGS

FIG. 2 is a time chart for a description of the operation of the semiconductor integrated circuit device shown in FIG. 1.

DETAILED DESCRIPTION OF THE PREFERRED EMBODIMENT

Figure 1:
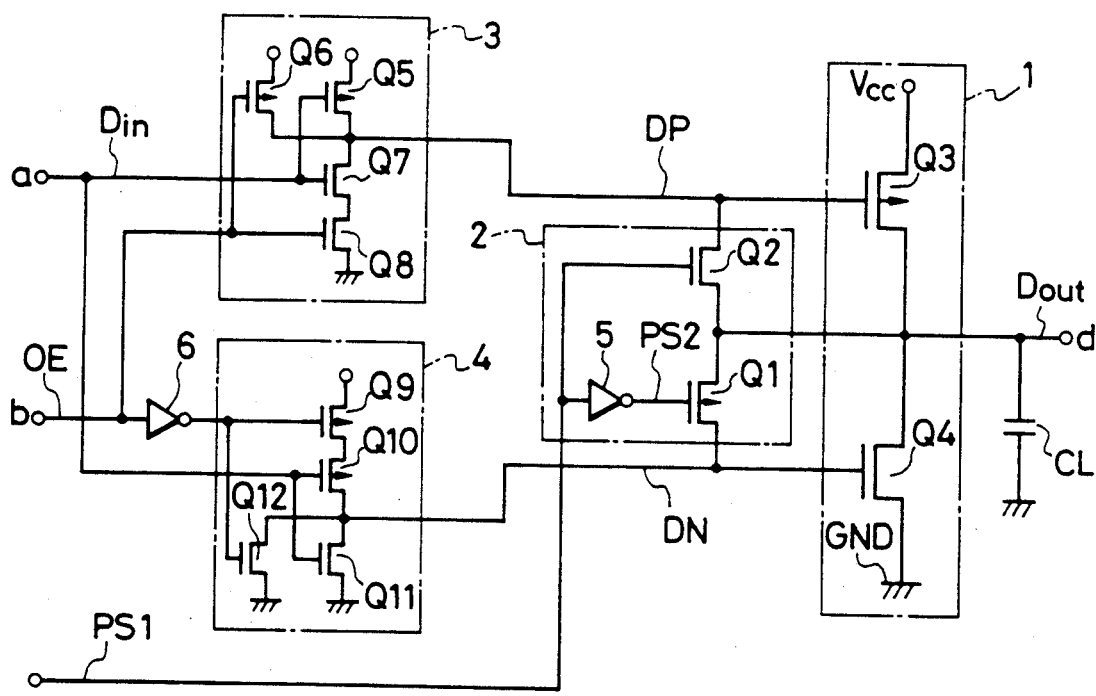
FIG. 1 is a circuit diagram showing one example of a semiconductor integrated circuit device according to this invention.
Figure 3:
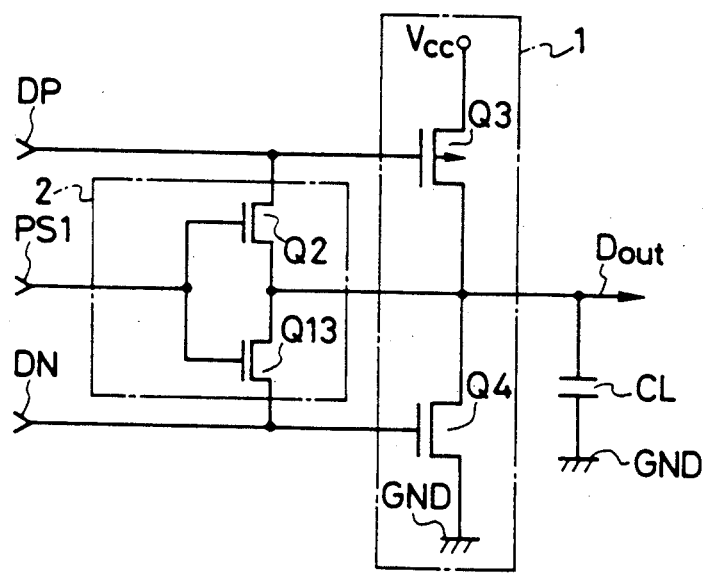
FIG. 3 is a circuit diagram showing one example of a conventional semiconductor integrated circuit device.

One example of a semiconductor integrated circuit device according to this invention, as shown in FIG. 1, comprises: an output MOSFET circuit including a P-type MOSFET Q3 and an N-type MOSFET Q4; an intermediate potential setting circuit 2 including a P-type MOSFET Q1 and an N-type MOSFET Q2; a NAND gate 3 including P-type MOSFETs Q5 and Q6 and N-type MOSFETs Q7 and Q8; a NOR gate 4 including P-type MOSFETs Q9 and Q10 and N-type MOSFETs Q11 and Q12; inverters 5 and 6; an input terminal Din; an output terminal Dout; and a load capacitor CL. Further in FIG. 1, reference character DP designates a first output control signal; DN, a second output control signal; PS1, a third output control signal; PS2, a fourth output control signal; and OE, an output enable signal.

The operation of the semiconductor integrated circuit device thus organized will be described with reference to a time chart shown in FIG. 2.

When the output enable signal OE is set to "L" from "H", the first output control signal DP is raised to "H" while the second output control signal DN is set to "L", and both of the MOSFETs Q3 and Q4 forming the output MOSFET circuit 1 are rendered non-conductive (off). In this case, the output terminal Dout is held at "H" or "L" depending on whether the load capacitor CL is charged or discharged. Then, the third output control signal PS1 is raised to "H". In this case;

(1) If the output terminal Dout is initially at "L", the drain, gate and source of the N-type MOSFET Q2 forming the intermediate potential setting circuit 2 are "H", "H" and "L", respectively, and therefore the MOSFET Q2 is rendered conductive, so that charging current flows in the load capacitor CL through the MOSFET Q2, and the potential of the output terminal Dout is increased.

(2) In this operation, the potential of the first output control signal DP is made lower than the "H" level temporarily because the MOSFET Q2 is rendered conductive (on) as was described above. If the decrease of the potential exceeds the threshold value of the P-type MOSFET Q3, then the latter Q3 is also rendered conductive (on). As a result, current flowing through the MOSFET Q3 is also applied to the load capacitor CL, so that the potential of the output terminal Dout reaches the intermediate potential quickly.

(3) On the other hand, immediately after the intermediate potential setting signal PS1 is raised to "H", i.e., the gate of the MOSFET Q1 is set to "L", the drain, gate and source of the P-type MOSFET Q1 are at "L", "L" and "L", respectively, and therefore the P-type MOSFET Q1 is non-conductive (off). However, when the potential of the output terminal Dout increases until the drain-source voltage of the MOSFET Q1 exceeds its threshold voltage Vth, the MOSFET Q1 is turned on, so that a through-current flows in both the MOSFETs Q2 and Q1. In this case, the source and drain of the P-type MOSFET Q1 are held lower than "H", and because of the substrate bias effect the threshold voltage is higher than at the zero bias (with the source or drain held at "H") Accordingly, the P-type MOSFET Q1 is turned on later than the N-type MOSFET Q2. And, as the channel resistance of the P-type MOSFET Q1 is higher than that of the N-type MOSFET Q2 because of the substrate bias effect, the through current is smaller than that in the conventional semiconductor integrated circuit device in which the intermediate potential setting circuit comprises only the N-type MOSFETs. When the P-type MOSFET Q1 is turned on, the second output control signal DN is raised from "L"; however, it cannot reach the threshold voltage of the N-type MOSFET Q4 because of the high channel resistance of the P-type MOSFET Q1, and no through current flows in the output MOSFET circuit 1 (Q3 and Q4).

(4) In the case where the output terminal Dout is initially held at "H", the P-type MOSFET Q1 is turned on immediately when the intermediate potential setting signal PS1 is raised to "H", so that the load capacitor CL is discharged through the MOSFET Q1, and the potential of the output terminal Dout is decreased from "H". In this operation, the second output control signal DN is raised from "L" temporarily, to turn on the N-type MOSFET Q4. As a result, the load capacitor is discharged through the MOSFET Q4 too, and the potential of the output terminal Dout reaches the intermediate potential quickly.

(5) On the other hand, the N-type MOSFET Q2 is turned on after the potential of the output terminal Dout is decreased and the drain-source voltage exceeds the threshold voltage of the MOSFET Q2. However, since the potentials of the source and the drain of the MOSFET Q2 are higher than "L", and because of the substrate bias effect, the threshold voltage Vth is higher than at the zero bias time (the source or drain held at "L"). Accordingly, the N-type MOSFET Q2 is turned on later than the P-type MOSFET Q1. And because of the substrate bias effect, the channel resistance of the MOSFET Q2 is higher than that of the MOSFET Q1, and therefore the through current is small. When the MOSFET Q2 is turned on, the potential of the first output control signal DP is decreased from "H"; however, since the channel resistance of the MOSFET Q2 is high, the descrease of the potential does not exceeds the threshold voltage of the P-type MOSFET Q3, and no through current flows in the output MOSFET circuit 1 (Q3 and Q4).

As is apparent from the above description, whether the output terminal is initially held at "H" or "L", by setting the output enable signal OE to "L" and raising the third output control signal PS1 to "H", the potential of the output terminal Dout can be quickly set to the intermediate potential which is determined by the ratio of resistance of the P-type MOSFET Q1 and the N-type MOSFET Q2. Thereafter, by setting the third output control signal PS1 to "L" and raising the output enable signal OE to "H", the potential of the output terminal Dout is set to "H" or "L" according to the level of the input terminal Din.

As was described above, in outputting data, the potential of the output terminal is changed from the intermediate potential at all times. Therefore, the time required for outputting the data is reduced, the peak value of the charging or discharging current accompanying the variation of output is small, and noise induced in the power source line or ground line is suppressed.

In the above-described embodiment, the output enable signal OE is controlled by the NAND gate 3 and the NOR gate 4 to set the first and second output control signals DP and DN respectively to "H" and "L". This control may be carried out with any means which can set the first and second output control signals DP and DN to "H" and "H", "L" and "L", or "H" and "L",. respectively.

In the above-described embodiment, the third and fourth control signals PS1 and PS2 may be any pair of complementary signals opposite in logical value from each other. And the circuitry should be such that the gates of the N-type MOSFET Q2 and the P-type MOSFET Q1 are held at "H" and "L", respectively, for a certain period of time.

As was described above, in the semiconductor integrated circuit device comprising the output MOSFET circuit and the intermediate potential setting circuit for setting the potential of the output terminal to the intermediate potential prior to variation of the output, the intermediate potential can be set without increasing the through current. Therefore, with the semiconductor integrated circuit device of the invention, the data outputting operation can be achieved at high speed, the charging or discharging current of the load capacitor can be reduced in peak value, and noises induced can be suppressed.

What is claimed is:

1. A semiconductor integrated circuit device comprising:
    an output MOSFET circuit having a pair of MOSFETs which include respective gate electrodes and an output terminal at a junction between said pair of MOSFETs, the pair of MOSFETs being controlled by first and second output control signals, respectively, to provide a logical signal at said output terminal of one of two potentials; and
    an intermediate potential setting circuit connected between said gate electrodes of said pair of MOSFETs and having an output connected to said output terminal of said output MOSFET circuit and controlled by third and fourth different output control signals applied at a predetermined time prior to a variation of said logical signal at said output terminal by said output MOSFET circuit, said third and fourth output control signals being different from said first and second output control signals, for setting said output terminal at an intermediate potential between said two potentials in accordance with said third and fourth output control signals.

2. A device as claimed in claim 1, in which said pair of MOSFETs circuit comprises a first P-type MOSFET and a first N-type MOSFET,
    said first P-type MOSFET having a source electrode connected to a first reference potential, a drain electrode connected to said output terminal, and a gate electrode connected to receive said first output control signal, and
    said first N-type MOSFET having a source electrode connected to a second reference potential, a drain electrode connected to said output terminal, and a gate electrode connected to receive said second output control signal.

3. A device as claimed in claim 1 or 2, in which
    said intermediate potential setting circuit comprises a second N-type MOSFET and a second P-type MOSFET,
    said second N-type MOSFET having a source electrode connected to said output terminal, a drain electrode connected to receive said first output control signal, and a gate electrode connected to receive said third output control signal, and said second P-type MOSFET having a source electrode connected to said output terminal, a drain electrode connected to receive said second output control signal, and a gate electrode connected to receive said fourth output control signal, and
    said third and fourth output control signals being a pair of complementary signals different in logic value.

4. A device as claimed in claim 1, further comprising:
    a third P-type MOSFET having a source connected to a third reference potential, a drain connected to a line providing said first output control signal and a gate electrode connected to receive a fifth output control signal; and
    a third N-type MOSFET having a source connected to a fourth reference potential, a drain connected to a line providing said second output control signal and a gate electrode connected to receive a complement of said fifth output control signal, a level of said first and second control signals being controlled in accordance with a level of said fifth output control signal.

5. A device as claimed in claim 2, further comprising:
    a third P-type MOSFET having a source connected to a third reference potential, a drain connected to a line providing said first output control signal and a gate electrode connected to receive a fifth output control signal; and
    a third N-type MOSFET having a source connected to a fourth reference potential, a drain connected to a line providing said second output control signal and a gate electrode connected to receive a complement of said fifth output control signal, a level of said first and second control signals being controlled in accordance with a level of said fifth output control signal.

6. A device as claimed in claim 3, further comprising:
    a third P-type MOSFET having a source connected to a third reference potential, a drain connected to a line providing said first output control signal and a gate electrode connected to receive a fifth output control signal; and a third N-type MOSFET having a source connected to a fourth reference potential, a drain connected to a line providing said second output control signal and a gate electrode connected to receive a complement of said fifth output control signal, a level of said first and second control signals being controlled in accordance with a level of said fifth output control signal.

7. A semiconductor integrated circuit device, comprising:

an output MOSFET circuit including a first p-channel MOSFET having a gate electrode and being connected between a high potential and an output node, and a first n-channel MOSFET having a gate electrode and being connected between said output node and a low potential, said gate electrodes of said first p-channel MOSFET and said first n-channel MOSFET receiving respective input signals, said output MOSFET circuit outputting one of said high potential and said low potential to said output node accordingly; and an intermediate potential setting circuit including a second n-channel MOSFET having a gate electrode and being connected between said gate electrode of said first p-channel MOSFET and said output node, said gate electrode of said second n-channel MOSFET having a high potential applied thereto during an intermediate potential setting period, said intermediate potential setting circuit further including a second p-channel MOSFET having a gate electrode and being connected between said gate electrode of said first n-channel MOSFET and said output node, said gate electrode of said second p-channel MOSFET having a low potential applied thereto during said intermediate potential setting period, said intermediate potential setting circuit setting said output node at an intermediate potential between said high and low potentials.

* * * * *